US012733230B2

(12) United States Patent
Yoon

(10) Patent No.: US 12,733,230 B2
(45) Date of Patent: Sep. 8, 2026

(54) METHOD FOR FABRICATING SEMICONDUCTOR DEVICE

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 439 days.

(21) Appl. No.: 18/538,469

(22) Filed: Dec. 13, 2023

(65) Prior Publication Data

US 2025/0006801 A1 Jan. 2, 2025

(30) Foreign Application Priority Data

Jun. 28, 2023 (KR) ........................ 10-2023-0083293

(51) Int. Cl.

*H10W 20/00* (2026.01)
*H10D 64/01* (2025.01)
*H10P 50/26* (2026.01)
*H10P 50/28* (2026.01)

(52) U.S. Cl.

CPC ........... *H10D 64/01* (2025.01); *H10P 50/264* (2026.01); *H10P 50/282* (2026.01); *H10W 20/056* (2026.01); *H10W 20/081* (2026.01)

(58) Field of Classification Search

CPC ..... H10D 64/01; H10P 50/264; H10P 50/282; H10B 12/09; H10B 12/50; H10W 20/056; H10W 20/069; H10W 20/081

See application file for complete search history.

(56) References Cited

U.S. PATENT DOCUMENTS

2022/0037251 A1 2/2022 Park et al.
2022/0181329 A1 6/2022 Choi et al.
2024/0244835 A1* 7/2024 Rim ....................... H10B 12/09
2025/0063817 A1* 2/2025 Zou .................... H10D 30/6735

* cited by examiner

*Primary Examiner* — Hoai V Pham
(74) *Attorney, Agent, or Firm* — IP&T GROUP LLP

(57) ABSTRACT

According to the embodiment of the present invention, it is possible to minimize the loss of the substrate that may be caused by the difference in etching height by taking advantage of the difference in the etch selectivity between a nitride material, an oxide material, and a conductive material, and minimizing the exposure of the substrate while each contact hole is formed. According to the embodiment of the present invention, a loss of the substrate may be minimized when contact holes having different etching depths are formed.

33 Claims, 22 Drawing Sheets

METHOD FOR FABRICATING SEMICONDUCTOR DEVICE

CROSS-REFERENCE TO RELATED APPLICATIONS

The present application claims priority of Korean Patent Application No. 10-2023-0083293, filed on Jun. 28, 2023, which is incorporated herein by reference in its entirety.

BACKGROUND

1. Field

Various embodiments of the present invention relate to a method for fabricating a semiconductor device, and more particularly, to a method for fabricating a semiconductor device including contact holes of different etch depths.

2. Description of the Related Art

A semiconductor device includes a plurality of semiconductor elements including a contact disposed at an end of a conductive line for electrical connection to a metal line of a power supply.

Conductive lines have different step heights, causing contacts to have different etch depths which causes problems during manufacturing. Hence, providing an improved manufacturing method that reduces or eliminates these problems is needed.

SUMMARY

Embodiments of the present invention are directed to a method for fabricating a semiconductor device that minimizes substrate loss, when contact holes having different etch depths are formed.

In accordance with an embodiment of the present invention, a method for fabricating a semiconductor device includes: forming first and second etch targets, the second etch target being disposed at a higher level than a top surface of the first etch target; forming a dielectric layer over the first and second etch targets; forming first and second open portions each having a bottom surface at the same level as a top surface of the second etch target and overlapping with the first and second etch targets, respectively, by etching the dielectric layer; forming a sacrificial layer to gap-fill the bottom portion of the second open portion; forming a first contact hole exposing the first etch target by etching the dielectric layer on the bottom surface of the first open portion; forming a second contact hole exposing the second etch target on the bottom surface of the second open portion by removing the sacrificial layer; and forming a contact by gap-filling the first and second contact holes with a conductive material.

In accordance with another embodiment of the present invention, a method for fabricating a semiconductor device includes: providing a substrate having a first region and a second region; forming a first conductive structure having a bottom surface at a lower level than a top surface of the substrate and including a first conductive line and a capping layer stacked therein in the substrate of the first region; forming a second conductive structure in which a second conductive line and a first hard mask are stacked over the substrate of the first region; forming a third conductive structure in which a third conductive line and a second hard mask are stacked over the substrate of the second region; forming an interlayer dielectric layer over the first conductive structure and the substrate; forming first to fourth open portions that pass through the interlayer dielectric layer to partially expose the capping layer of the first conductive structure, the first hard mask of the second conductive structure, the second hard mask of the third conductive structure, and the substrate of the second region, respectively; forming a sacrificial layer to fill a bottom portion of the fourth open portion; forming first to third contact holes exposing portions of the first to third conductive lines by etching the capping layer, the first hard mask, and the second hard mask on bottom surfaces of the first to third open portions; forming a fourth contact hole exposing a portion of the substrate of the second region by removing the sacrificial layer; and forming first to fourth contacts by gap-filling the first to fourth contact holes with a conductive material.

BRIEF DESCRIPTION OF THE DRAWINGS

FIGS. 3A to 13A are cross-sectional views illustrating a method for fabricating a semiconductor device according to a line A-A' shown in FIG. 2.

FIGS. 3B to 13B are cross-sectional views illustrating a method for fabricating a semiconductor device according to a line B-B' shown in FIG. 2.

FIGS. 3C to 13C are cross-sectional views illustrating a method for fabricating a semiconductor device according to a line C-C' shown in FIG. 2.

DETAILED DESCRIPTION

Figure 1A:
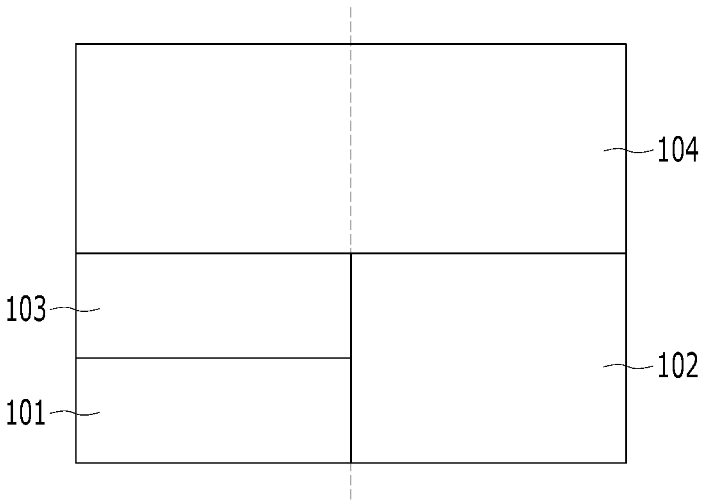
FIGS. 1A to 1I are cross-sectional views illustrating a method for fabricating a semiconductor device in accordance with an embodiment of the present invention.

Various embodiments of the present invention are described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly over the second layer or the substrate but also a case where a third layer exists between the first layer and the second layer or the substrate.

A semiconductor memory device, in particular a Dynamic Random Access Memory (DRAM) device, may include two regions, e.g., a first region (also referred to as a cell array) in which memory cells are arranged in a matrix form, and a second region (also referred to as a peripheral circuit region) which includes a non-repetitive circuit that stores and transfers data and drives the cell array.

FIGS. 1A to 1I are cross-sectional views illustrating a method for fabricating a semiconductor device in accordance with an embodiment of the present invention.

Referring to FIG. 1A, first and second dielectric layers 103 and 104 may be formed over first and second etch targets 101 and 102. The top surface of the first etch target 101 and the top surface of the second etch target 102 may be disposed at different levels. The top surface of the second etch target 102 may be disposed at a higher level than the top surface of the first etch target 101.

The first etch target 101 and the second etch target 102 may be formed in the same region or different regions. The first and second etch targets 101 and 102 may include the same material or different materials. The first etch target 101 and the second etch target 102 may be conductive lines that are disposed at different levels. One of the first etch target 101 or the second etch target 102 may be a substrate, and the other may be a conductive line. For example, the first etch target 101 may include a gate electrode of a buried word line which is formed in the substrate of a cell region. For example, the second etch target 102 may include the substrate of a peripheral region.

The top surface of the first dielectric layer 103 may be disposed at the same level as the top surface of the second etch target 102. The first and second dielectric layers 103 and 104 may include a material having etch selectivity with respect to the first and second etch targets 101 and 102. The first and second dielectric layers 103 and 104 may include the same material. According to another embodiment of the present invention, the first and second dielectric layers 103 and 104 may be continuous single layers. For example, the first and second dielectric layers 103 and 104 may include silicon oxide, silicon nitride, or a stacked structure thereof.

According to another embodiment of the present invention, the first and second dielectric layers 103 and 104 may include dielectric materials having different etch selectivities. For example, the first dielectric layer 103 may include silicon nitride, and the second dielectric layer 104 may include silicon oxide.

According to an embodiment of the present invention, when the first etch target 101 is a gate electrode of a buried word line that is formed in the substrate of the cell region and the second etch target 102 is the substrate of the peripheral region, the first dielectric layer 103 may be a gate capping layer, and the second dielectric layer 104 may be an interlayer dielectric layer.

Figure 1B:
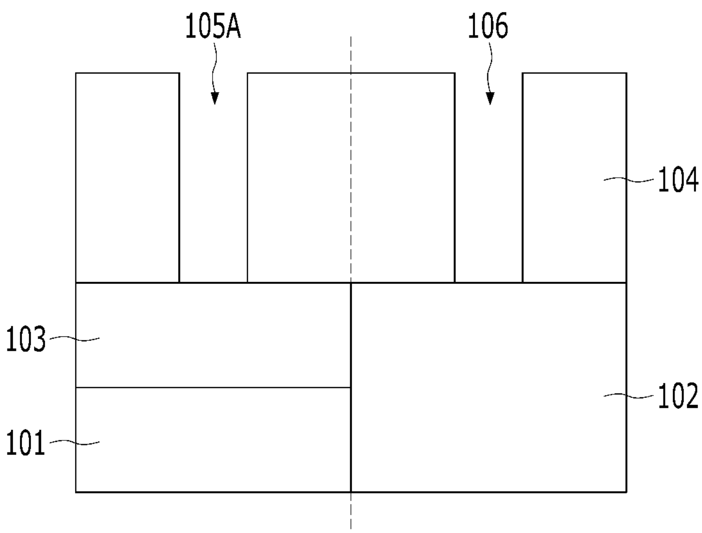

Referring to FIG. 1B, first and second open portions 105A and 106 respectively overlapping with the first and second etch targets 102 may be formed passing through the second dielectric layer 104. The bottom surfaces of the first and second open portions 105A and 106 may be disposed at the same level. A portion of the first dielectric layer 103 may be exposed by the first open portion 105A. A portion of the second etch target 102 may be exposed by the second open portion 106.

Figure 1C:
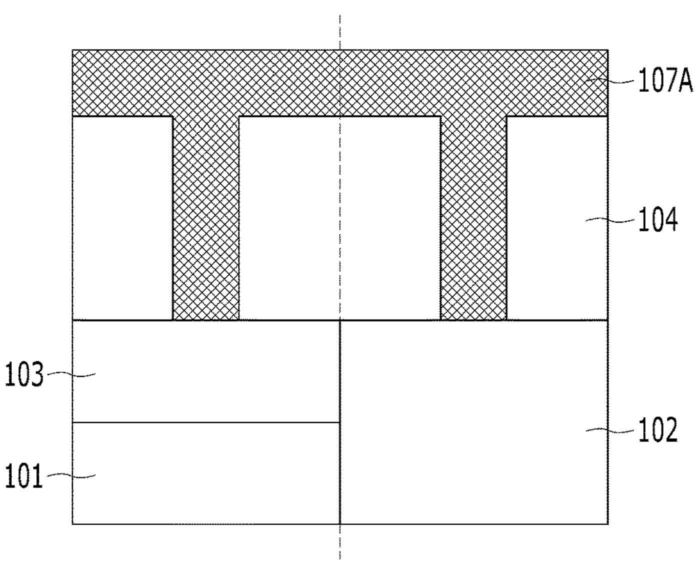

Referring to FIG. 1C, a sacrificial material 107A may be formed to gap-fill the first and second open portions 105A and 106. The sacrificial material 107A may include a material having etch selectivity with respect to the first and second dielectric layers 103 and 104 and the first and second etch targets 101 and 102. The sacrificial material 107A may include a metal material. For example, the sacrificial material 107A may include tungsten, but the concepts and scope of the present invention are not limited thereto.

Figure 1D:
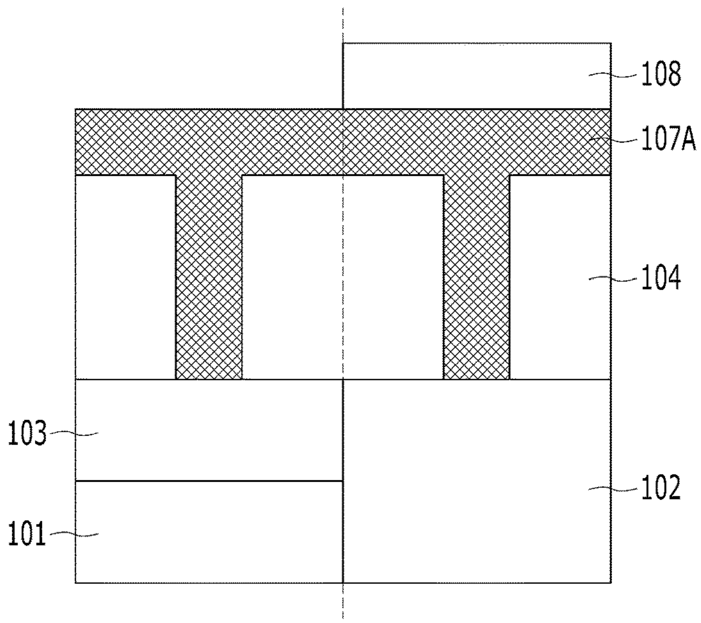

Referring to FIG. 1D, a mask pattern 108 may be formed and may overlap with the second etch target 102. Forming the mask pattern 108 may include first applying a thin layer of a photoresist material over the sacrificial material 107A and then performing a patterning process to expose the first open portion 105A (see FIG. 1B). The patterning process includes covering the sacrificial material 107A gap-filling the second open portion 106 with the mask pattern 108 while the sacrificial material 107A gap-filling the first open portion 105A is exposed as illustrated in FIG. 1D.

Figure 1E:
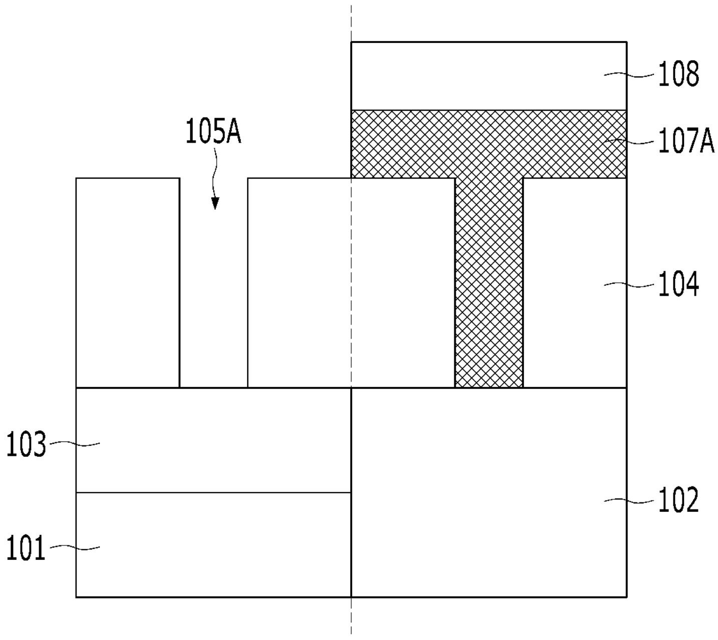

Referring to FIG. 1E, the sacrificial material 107A gap-filling the first open portion 105A may be removed by an etching process The first dielectric layer 103 may not be etched depending on the etch selectivity with the sacrificial material 107A. Thus, the first open portion 105A may expose a portion of the first dielectric layer 103.

Subsequently, the mask pattern 108 may be removed.

Figure 1F:
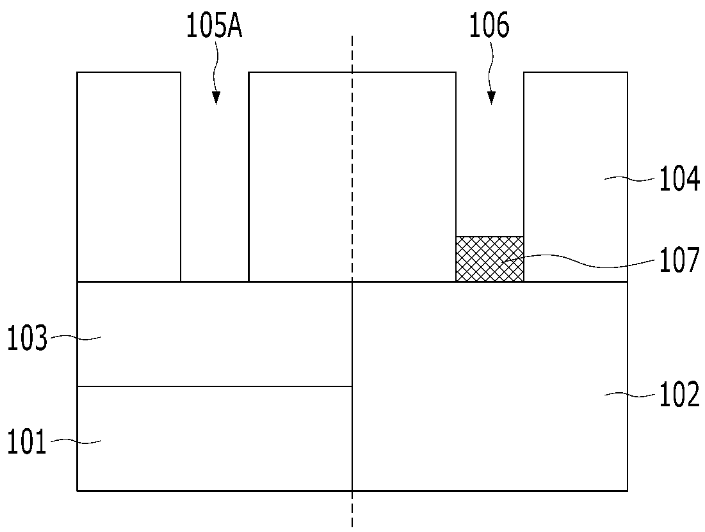

Referring to FIG. 1F, a sacrificial layer 107 may be formed to gap-fill the bottom portion of the second open portion 106. The sacrificial layer 107 may be formed through a process of etching the sacrificial material 107A to a predetermined depth so that the sacrificial material 107A remains in the bottom portion of the second open portion 106.

Since the sacrificial layer 107 is not formed on the bottom surface of the first open portion 105A, a portion of the first dielectric layer 103 may be exposed. The second etch target 102 may not be exposed because of the sacrificial layer 107 left inside the second open portion 106.

Figure 1G:
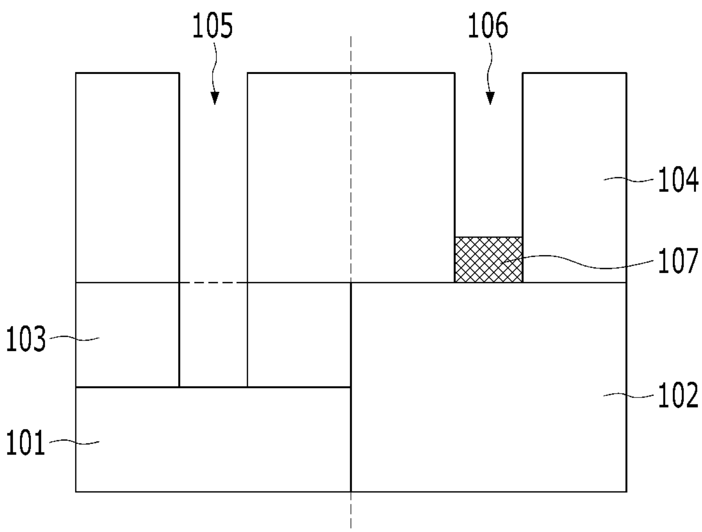

Referring to FIG. 1G, a first contact hole 105 exposing the first etch target 101 may be formed by etching the first dielectric layer 103 which was exposed on the bottom surface of the first open portion 105A as shown in FIG. 1F. At the same time, the second etch target 102 may remain intact because the sacrificial layer 107 having etch selectivity with respect to the first dielectric layer 103 covers the bottom portion of the second open portion 106.

Figure 1H:
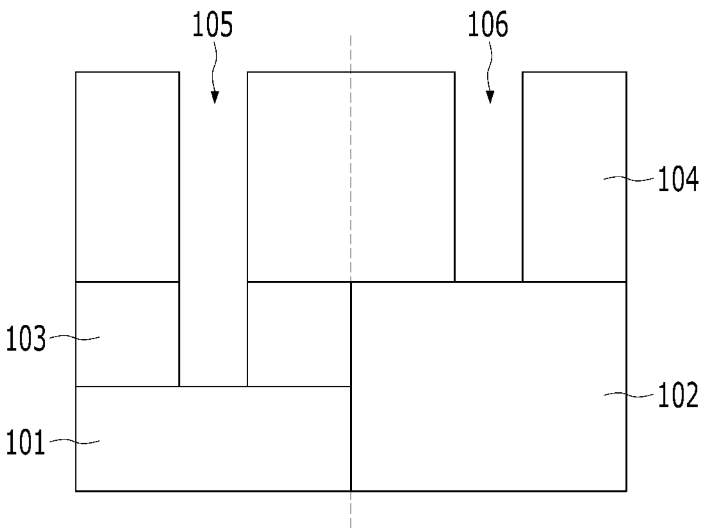

Referring to FIG. 1H, the sacrificial layer 107 may be removed. The second open portion 106 from which the sacrificial layer 107 is removed may be referred to as a 'second contact hole 106'.

Figure 1I:
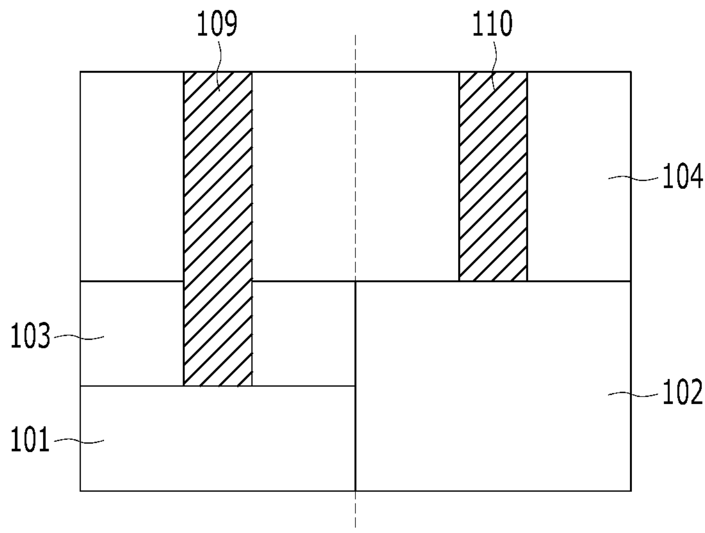

Referring to FIG. 1I, first and second contacts 109 and 110 respectively coupled to the first and second etch targets 101 and 102 may be formed by gap-filling the first and second contact holes 105 and 106 with a conductive material. The conductive material may include a metal material. For example, the conductive material may include tungsten, but the concepts and scope of the present invention are not limited thereto.

Figure 2:
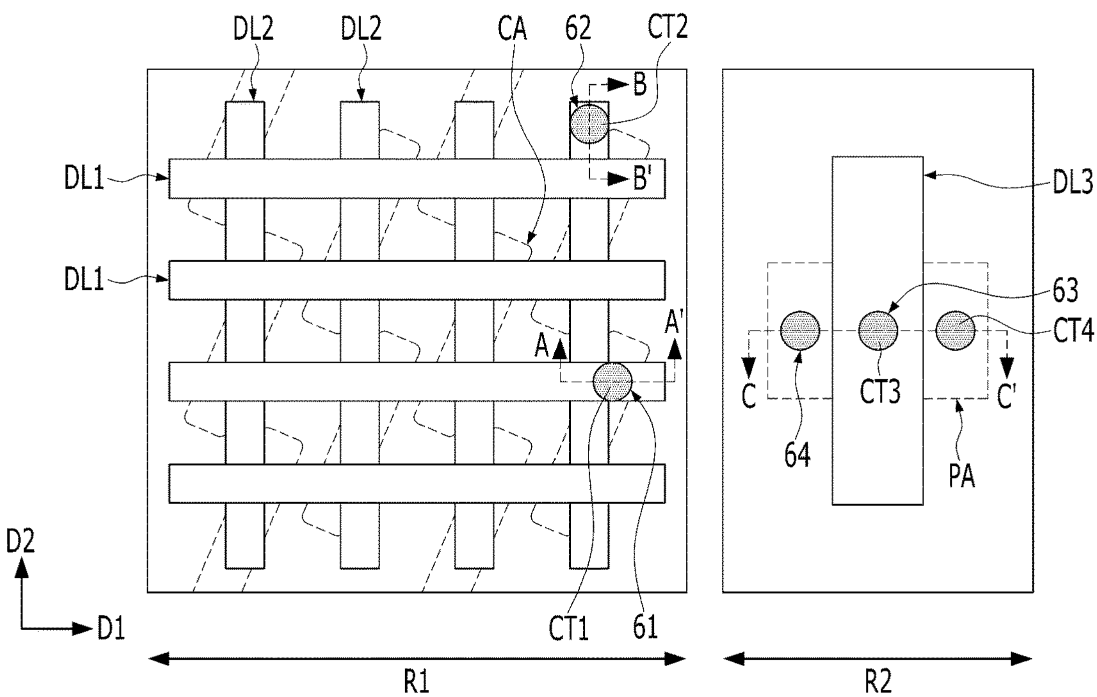
FIG. 2 is a plan view illustrating a semiconductor device in accordance with an embodiment of the present invention.

FIG. 2 is a plan view illustrating a semiconductor device in accordance with an embodiment of the present invention.

Referring to FIG. 2, the semiconductor device may include a first region R1 and a second region R2. For example, the first region R1 may include a cell region CELL, and the second region R2 may include a peripheral region PERI.

The cell region CELL is a region where a memory device is formed. The cell region CELL may be defined by an isolation layer and include a plurality of island-type cell active regions CA having long axis and short axis. Each island-type cell active region CA may be tilted. The cell active regions CA may be spaced apart from each other. A plurality of first conductive lines DL1 and a plurality of second conductive lines DL2 may be disposed over the cell active regions CA. The first conductive lines DL1 may extend in a first direction D1 and maybe spaced apart from each other in a second direction D2 which is perpendicular to the first direction. The second conductive lines DL2 may extend in the second direction D2 and may be spaced apart from each other in the first direction D1. The first conductive lines DL1 may cross over the second conductive lines DL2 at right angles. In one cell active region CA, two first conductive lines DL1 crossing the short axis direction of the cell active region CA and one second conductive line DL2 crossing the long axis direction of the cell active region CA may be disposed. The cell active region CA may be tilted at a predetermined angle to a direction that the first conductive line DL1 and the second conductive line DL2 extend. For example, the first conductive lines DL1 may be word lines, and the second conductive line DL2 may be a bit line.

First and second contacts CT1 and CT2 may be formed at the ends of the first and second conductive lines DL1 and DL2. In an embodiment, the first and second contacts CT1 and CT2 may connect the first and second conductive lines DL1 and DL2 to a metal line. For the sake of convenience in description, only one first contact CT1 and one second contact CT2 disposed in the first conductive lines DL1 and the second conductive lines DL2, respectively, are illustrated, but according to this embodiment of the present invention, the first and second contacts CT1 and CT2 may be formed in the first and second conductive lines DL1 and DL2 in 1:1 to supply electric power to the first and second conductive lines DL1 and DL2, respectively. For example, the first conductive lines DL1 of this embodiment of the present invention may be formed as buried conductive lines disposed at a level which is lower than the top surface of the substrate.

The peripheral region PERI may include a driving device for driving one or more memory devices formed in the cell region CELL are disposed. The peripheral region PERI may include a peripheral active region PA defined by an isolation layer. A third conductive line DL3 crossing the peripheral active region PA may be disposed over the peripheral active region PA. Third and fourth contacts CT3 and CT4 for connection to a metal line may be formed in the third conductive line DL3 and in the peripheral active regions PA on both sides of the third conductive line DL3. For example, the third conductive line DL3 may be a peripheral gate.

The first to fourth contacts CT1, CT2, CT3, and CT4 formed in the cell region CELL and the peripheral region PERI may be formed at the same time.

FIGS. 3A to 13A are cross-sectional views illustrating a method for fabricating a semiconductor device according to a line A-A' shown in FIG. 2. FIGS. 3B to 13B are cross-sectional views illustrating a method for fabricating a semiconductor device according to a line B-B' shown in FIG. 2. FIGS. 3C to 13C are cross-sectional views illustrating a method for fabricating a semiconductor device according to a line C-C' shown in FIG. 2.

Figure 3A:
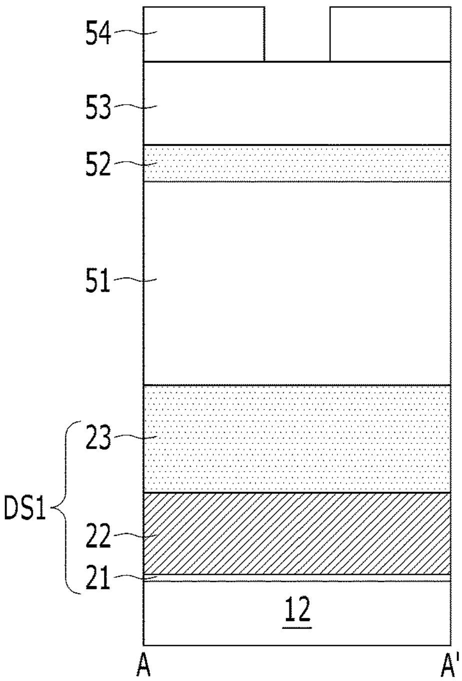
Figure 3B:
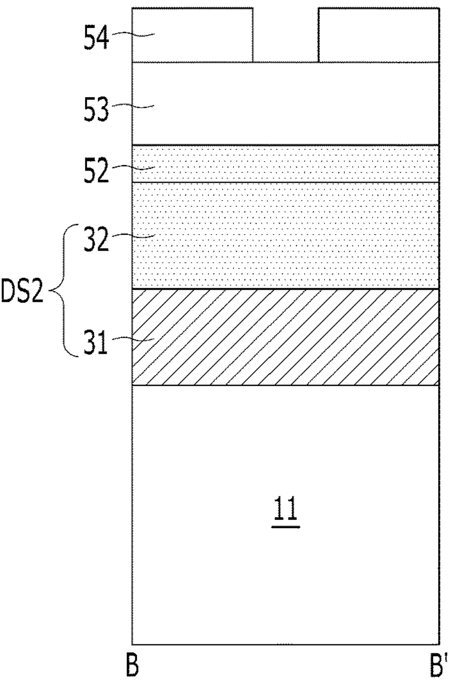
Figure 3C:
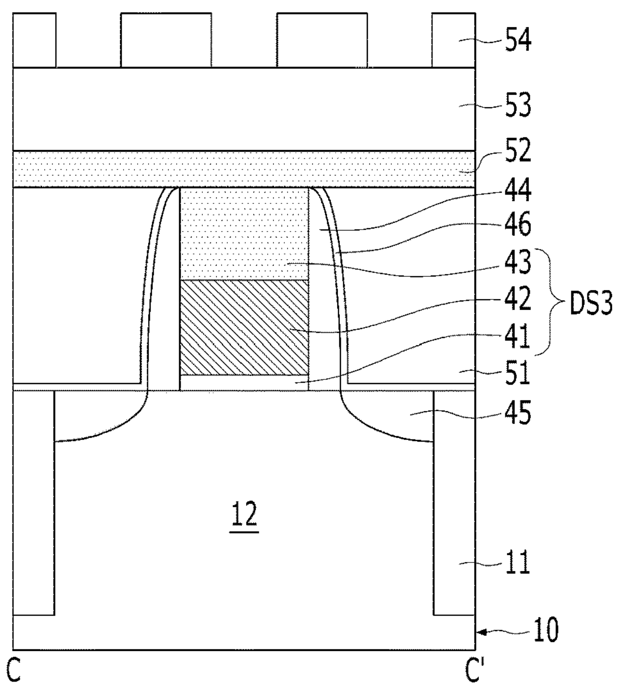

Referring now to FIGS. 3A to 3C, a substrate 10 may include an isolation layer 11 defining an active region 12. FIGS. 3A and 3B illustrate a first region R1 (see FIG. 2), and FIG. 3C illustrates a second region R2 (see FIG. 2). That is, the active region 12 of FIGS. 3A and 3B may be a cell active region CA (see FIG. 2), and the active region 12 of FIG. 3C may be a peripheral active region PA (see FIG. 2).

The substrate 10 may be a material suitable for semiconductor processing. The substrate 10 may include a semiconductor substrate. The substrate 10 may be formed of a silicon-containing material. The substrate 10 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 10 may also include another semiconductor material, such as germanium. The substrate 10 may include a III/V-group semiconductor substrate, for example, a compound semiconductor substrate such as GaAs. The substrate 10 may include a Silicon-On-Insulator (SOI) substrate.

The substrate 10 may divide the first region R1 (see FIG. 2) and the second region R2 (see FIG. 2) from each other through the isolation layer 11, and define, at the same time, active regions 12, that is, a cell active region CA (see FIG. 2) and a peripheral active region PA (see FIG. 2) in each of the first and second regions, respectively.

A first conductive structure DS1 may be formed in the substrate 10 of FIG. 3A. A second conductive structure DS2 may be formed over the substrate 10 of FIG. 3B. A third conductive structure DS3 may be formed over the substrate 10 of FIG. 3C.

Referring to FIG. 3A, the first conductive structure DS1 may be disposed over the active region 12. The first conductive structure DS1 may include a stacked structure of the first conductive line DL1 (see FIG. 2) and a capping layer 23. For example, the first conductive structure DS1 may include a buried gate structure. The first conductive structure DS1 may include a stacked structure of a cell gate dielectric layer 21, a cell gate electrode 22, and the capping layer 23. According to this embodiment of the present invention, the first conductive line DL1 (see FIG. 2) may correspond to the cell gate electrode 22 of the first conductive structure DS1.

The bottom surface of the first conductive structure DS1 may be disposed at a level lower than the top surface of the substrate 10. The top surface of the active region 12 on which the first conductive structure DS1 is formed may be disposed at a lower level than the top surface of the isolation layer 11 on which the second conductive structure DS2 is formed in FIG. 3B.

The first conductive structure DS1 may be formed through a series of processes of forming a line-shaped trench extending in the first direction D1 (see FIG. 2) across the active region 12 and the isolation layer 11 in the substrate 10, and then sequentially stacking the cell gate dielectric layer 21, the cell gate electrode 22, and the capping layer 23 to fill the trench.

The cell gate dielectric layer 21 may be formed by a thermal oxidation process. The cell gate dielectric layer 21 may be a liner type that is formed along the surface of the trench. According to another embodiment of the present invention, the cell gate dielectric layer 21 may be formed by Chemical Vapor Deposition (CVD) or Atomic Layer Deposition (ALD). The cell gate dielectric layer 21 may include a high-k material, an oxide (e.g., silicon dioxide), a nitride (e.g., silicon nitride), an oxynitride (e.g., silicon oxynitride), or a combination thereof. The high-k material may include a hafnium-containing material. The hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, or a combination thereof. As for the high-k material, other known high-k materials may be selectively used. The cell gate dielectric layer 21 may include a material having a high oxygen atomic plane density The cell gate electrode 22 may have a single-layer structure or a multi-layer structure. The cell gate electrode 22 may include a metal-based material or a semiconductor material. The cell gate electrode 22 may include a single-layer structure of one of a metal-based material and a semiconductor material, a stacked structure of a metal-based material and a semiconductor material, a stacked structure of semiconductor materials, or a stacked structure of metal-based materials. The metal-based material may include a metal material or a metal nitride. For example, the cell gate electrode 22 may include a stacked structure of titanium nitride. The cell gate electrode 22 may gap-fill a portion of the trench. In other words, the top surface of the cell gate electrode 22 may be disposed at a lower level than the top surface of the substrate 10.

The capping layer 23 may be formed over the cell gate electrode 22 for protecting the cell gate electrode 22. The capping layer 23 may include a dielectric material. For example, the capping layer 23 may include silicon nitride formed, for example, by CVD or ALD. The capping layer 23 may gap-fill the remainder of the trench. The top surface of the capping layer 23 may be disposed at the same level as the top surface of the substrate 10.

An interlayer dielectric layer 51 may be formed over the first conductive structure DS1. The interlayer dielectric layer 51 may be applied for separation between the upper and lower conductive lines and between conductive lines disposed at the same level. The interlayer dielectric layer 51 may include a dielectric material. The interlayer dielectric layer 51 may include a material having etch selectivity with respect to the capping layer 23. For example, the interlayer dielectric layer 51 may include silicon oxide. The interlayer dielectric layer 51 may be formed using a general deposition process such as CVD. According to another embodiment of the present invention, the interlayer dielectric layer 51 may include a low-k material.

Referring to FIG. 3B, the second conductive structure DS2 may be formed over the substrate 10. The second conductive structure DS2 may include a stacked structure of the second conductive line DL2 (see FIG. 2) and a first hard mask 32. For example, the second conductive structure DS2 may include a bit line structure. The second conductive structure DS2 may include a stacked structure of a bit line 31 and the first hard mask 32. According to this embodiment of the present invention, the second conductive line DL2 (see FIG. 2) may correspond to the bit line 31 of the second conductive structure DS2. The first hard mask 32 may be referred to as a 'bit line hard mask 32'.

Although not illustrated, a portion of the bit line 31 may be coupled to the substrate 10 through a bit line contact plug. The bit line 31 may include a metal material, such as tungsten. The first hard mask 32 may include a dielectric material. For example, the first hard mask 32 may include silicon nitride.

Referring to FIG. 3C, a third conductive structure DS3 may be formed over the substrate 10. The third conductive structure DS3 may include a stacked structure of the third conductive line DL3 (see FIG. 2) and the second hard mask 43. For example, the third conductive structure DS3 may include a peripheral gate structure. The third conductive structure DS3 may include a stacked structure of a peripheral gate dielectric layer 41, a peripheral gate electrode 42, and a peripheral gate hard mask 43. According to this embodiment, the third conductive line DL3 (see FIG. 2) may correspond to the peripheral gate electrode 42 of the third conductive structure DS3. The second hard mask 43 may be referred to as a 'peripheral gate hard mask 43'.

Peripheral gate spacers 44 may be formed on both side walls of the third conductive structure DS3. Source/drain regions 45 may be formed over the substrate 10 on both sides of the third conductive structure DS3. A first etch stop layer 46 may be formed on the profile of the entire surface including the third conductive structure DS3.

The peripheral gate dielectric layer 41 may include a dielectric material. For example, the peripheral gate dielectric layer 41 may include silicon oxide. For another example, the peripheral gate dielectric layer 41 may include a high-k material.

The peripheral gate electrode 42 may include a conductive material. The peripheral gate electrode 42 may include a semiconductor material or a metal material. For example, the semiconductor material may include polysilicon. For example, the metal material may include tungsten or a tungsten-containing material.

The second hard mask 43 may include a dielectric material. The second hard mask 43 may be provided over the top surface of the peripheral gate electrode 42 for protecting the peripheral gate electrode 42 and for patterning the peripheral gate dielectric layer 41 and the peripheral gate electrode 42. The second hard mask 43 may be formed of a material having etch selectivity with respect to the peripheral gate dielectric layer 41 and the peripheral gate electrode 42. For example, the second hard mask 43 may include silicon nitride.

The peripheral gate spacers 44 may include a dielectric material. For example, the peripheral gate spacers 44 may include a single-layer structure of one selected from among silicon nitride, silicon oxide, silicon oxynitride, and low-k materials. As another example, the peripheral gate spacers 44 may include a stacked structure of two or more of silicon nitride, silicon oxide, silicon oxynitride, and low-k materials.

The first etch stop layer 46 may prevent a loss of the substrate 10 during a subsequent contact process, and may include a material having etch selectivity with respect to the interlayer dielectric layer 51 and the substrate 10. For example, the first etch stop layer 46 may include silicon nitride.

The interlayer dielectric layer 51 may be formed over the first etch stop layer 46. The interlayer dielectric layer 51 may be applied to separate the neighboring third conductive structures DS3. The interlayer dielectric layer 51 may include a continuous single layer, or a continuous laminated structure in the first and second regions R1 and R2 (see FIG. 2).

The second conductive structure DS2 and the third conductive structure DS3 may be simultaneously formed through a single patterning process, but the concepts and scope of the present invention are not limited thereto.

A second etch stop layer 52 may be formed over the interlayer dielectric layer 51 and the second conductive structure DS2. The second etch stop layer 51 may be formed of the same material as that of the first etch stop layer 46. The second etch stop layer 52 may be a material having etch selectivity with respect to the interlayer dielectric layer 51. For example, the second etch stop layer 52 may include silicon nitride.

A third hard mask layer 53 may be formed over the second etch stop layer 52. The third hard mask layer 53 may include a material having etch selectivity with respect to the second etch stop layer 52, the first hard mask 32, and the second hard mask 43. The third hard mask layer 53 may have a single-layer structure. The third hard mask layer 53 may have a multi-layer structure. For example, the third hard mask layer 53 may include a stacked structure of spin-on-carbon (SOC) and tetraethyl orthosilicate (TEOS), but the concepts and scope of the present invention are not limited thereto.

A first mask pattern 54 may be formed over the third hard mask layer 53. The first mask pattern 54 may be patterned to define contact regions in the first conductive structure DS1, the second conductive structure DS2, the third conductive structure DS3, and the substrate 10 of FIG. 3C. For example, the first mask pattern 54 may include a photoresist.

Figure 4A:
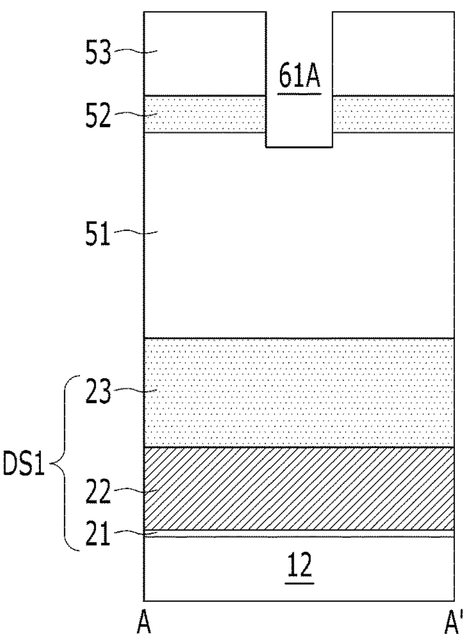
Figure 4B:
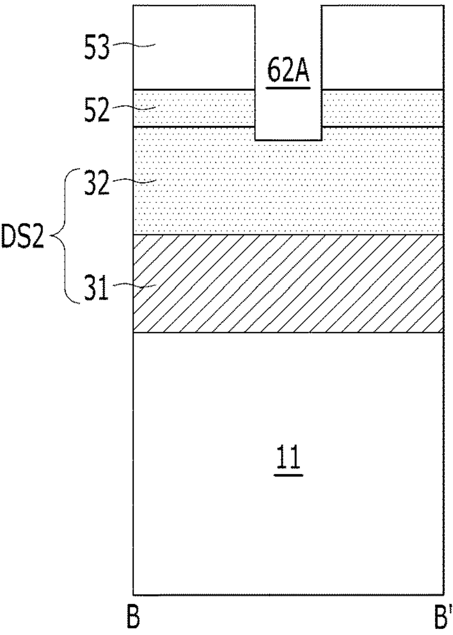
Figure 4C:
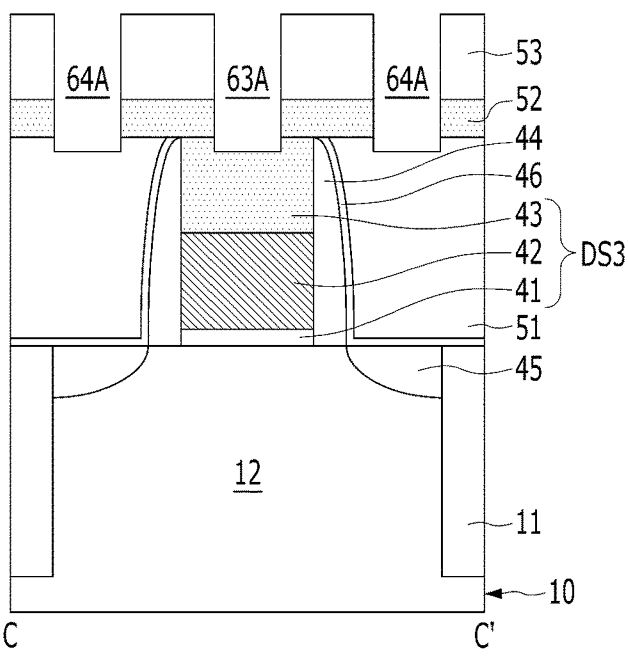

Referring to FIGS. 4A to 4C, the third hard mask layer 53 and the second etch stop layer 52 may be etched to form first to fourth open portions 61A, 62A, 63A, and 64A. The first to fourth open portions 61A, 62A, 63A, and 64A may be formed through a series of processes of using the first mask pattern 54 (see FIGS. 3A to 3C) as an etch barrier, etching the hard mask layer 53 for etching an oxide material, and then etching the second etch stop layer 52 for etching a nitride material. To improve open defects of the second etch stop layer 52, over-etching may be performed, and accordingly, the interlayer dielectric layer 51, the first hard mask 32, and the second hard mask 43 may be etched to a certain depth.

The first open portion 61A may be a contact hole for coupling between the first conductive structure DS1 and the metal line. The second open portion 62A may be a contact hole for coupling between the second conductive structure DS2 and the metal line. The third open portion 63A may be a contact hole for coupling between the third conductive structure DS3 and the metal line. The fourth open portion 64A may be a contact hole for coupling between the substrate 10 of FIG. 4C and the metal line. The first to fourth open portions 61A, 62A, 63A, and 64A may be simultaneously formed through a single etching process. The line widths of the first to fourth open portions 61A, 62A, 63A, and 64A may be adjusted according to the line width of each region. The line widths of the first to fourth open portions 61A, 62A, 63A, and 64A may all be the same. In a variation of the described embodiment, the line widths of the first to fourth open portions 61A, 62A, 63A, and 64A may be different from each other. In yet another variation, the line widths of some of the open portions may be the same, and the line widths of some of the open portions may be adjusted differently.

Figure 5A:
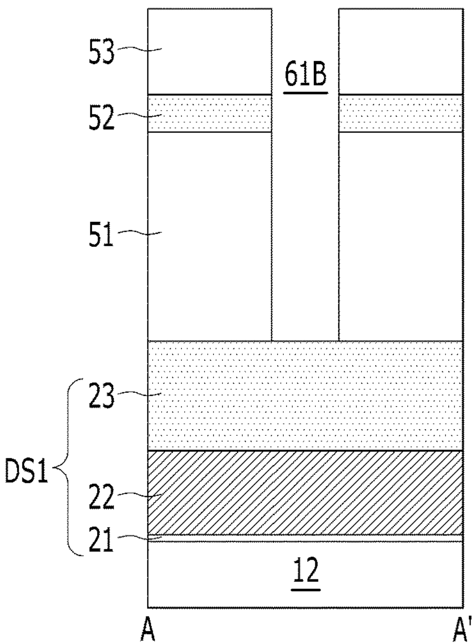
Figure 5B:
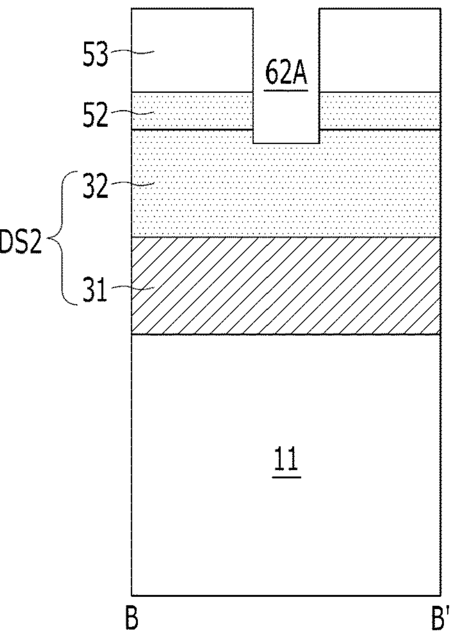
Figure 5C:
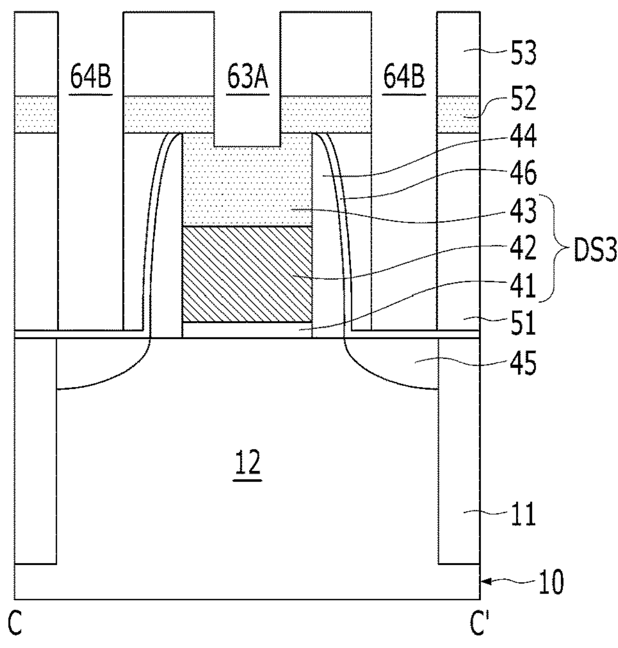

Referring to FIGS. 5A to 5C, the interlayer dielectric layer 51 may be etched. Etching the interlayer dielectric layer 51 may be performed under the condition of etching an oxide material. Etching the interlayer dielectric layer 51 may be performed targeting to expose the surface of the capping layer 23 and the first etch stop layer 46. As the etching is performed under the condition of etching the oxide material, the bottom surfaces of the first open portion 61B and the fourth open portion 64B may be selectively etched.

Since the first hard mask 32 and the second hard mask 43, which are materials having etch selectivity with respect to the interlayer dielectric layer 51, are exposed, the second open portion 62A and the third open portion 62A may not be etched but remain as they are.

According to another embodiment of the present invention, some thicknesses of the first hard mask 32 and the second hard mask 43 exposed on the bottom surfaces of the second open portion 62A and the third open portion 63A may be etched, and the etched thickness may be smaller than the thickness of the interlayer dielectric layer 51. Accordingly, the bit line 31 and the peripheral gate electrode 42 may be protected by the first hard mask 32 and the second hard mask 43.

Figure 6A:
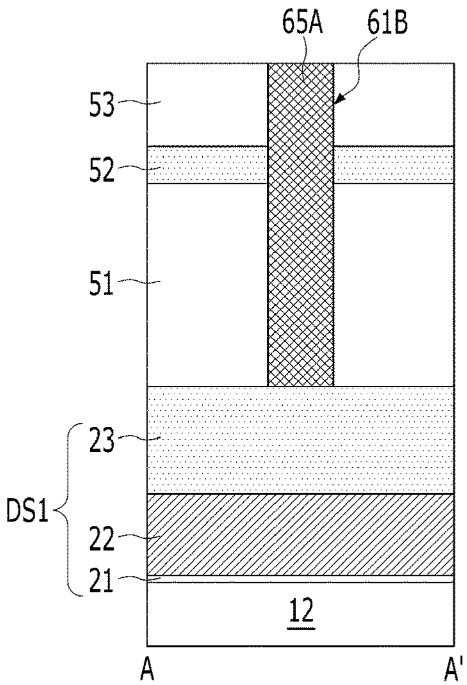
Figure 6B:
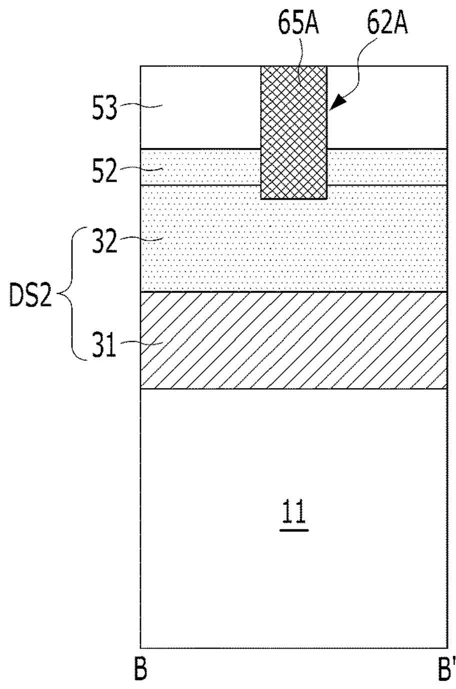
Figure 6C:
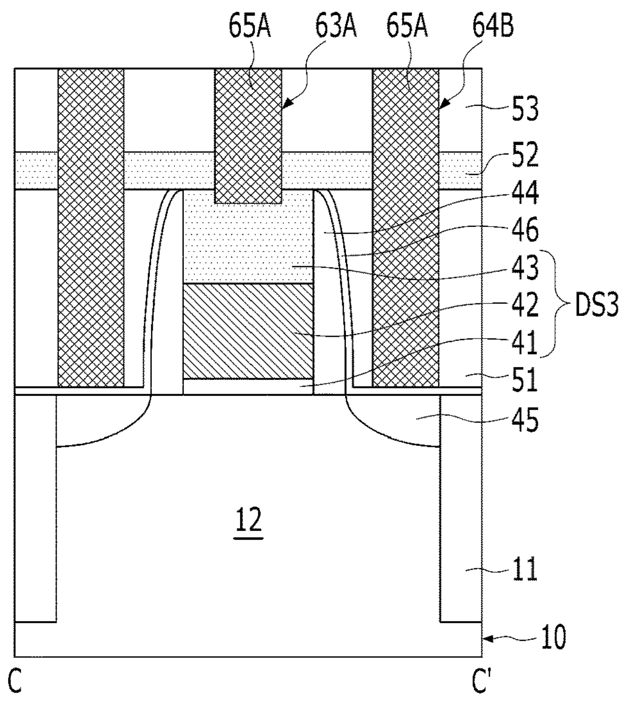

Referring to FIGS. 6A to 6C, a sacrificial material 65A filling the first to fourth open portions 61B, 62A, 63A, and 64B may be formed. The sacrificial material 65A may include a material having an etch selectivity with respect to an oxide material and a nitride material. The sacrificial material 65A may include a metal material. For example, the sacrificial material 65A may be tungsten.

The sacrificial material 65A may be formed through a series of processes of forming the sacrificial material 65A over the first to fourth open portions 61B, 62A, 63A, and 64B and the third hard mask layer 53 to fill the first to fourth open portions 61B, 62A, 63A, and 64B, and then etching the sacrificial material 65A formed on the surface of the hard mask layer 53. The etching process may be performed by an etch-back process or a Chemical Mechanical Polishing (CMP) process.

Figure 7A:
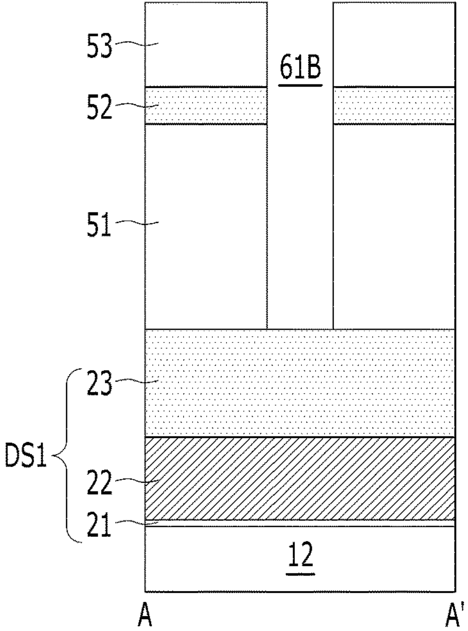
Figure 7B:
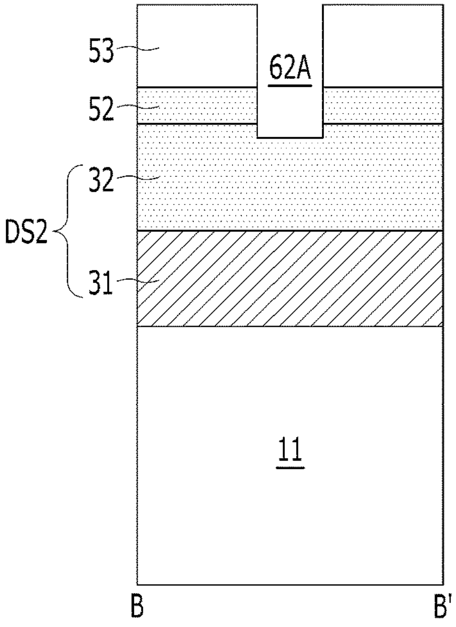
Figure 7C:
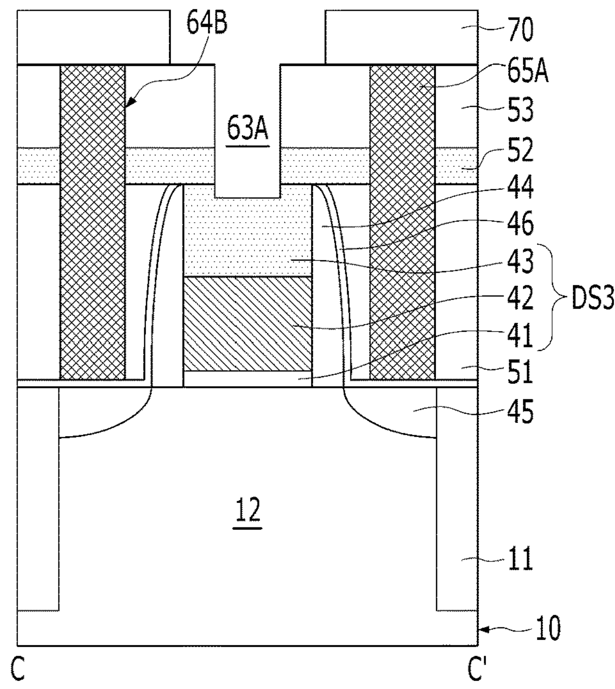

Referring now to FIGS. 7A to 7C, a second mask pattern 70 may be formed over the third hard mask layer 53. The second mask pattern 70 may open the first open portion 61B, the second open portion 62A, and the third open portion 63A. The second mask pattern 70 may be formed locally only over the third hard mask layer 53 of FIG. 7C to cover the fourth open portion 64B and open the remaining region except for the fourth open portion 64B.

Subsequently, the sacrificial material 65A gap-filling the first to third open portions 61B, 62A, and 63A may be removed. Accordingly, the sacrificial material 65A may remain only in the fourth open portion 64B.

Subsequently, the second mask pattern 70 may be removed.

Figure 8A:
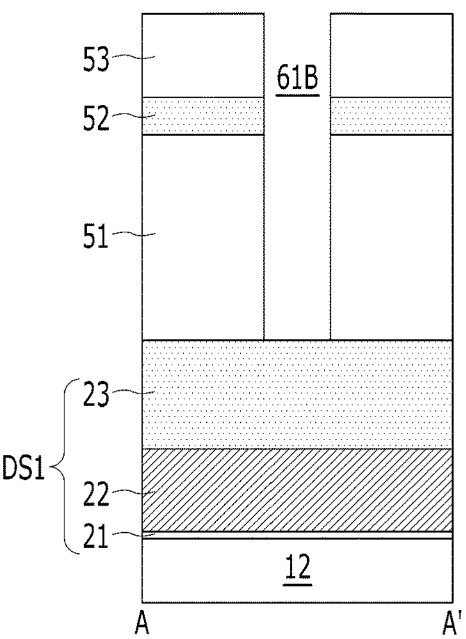
Figure 8B:
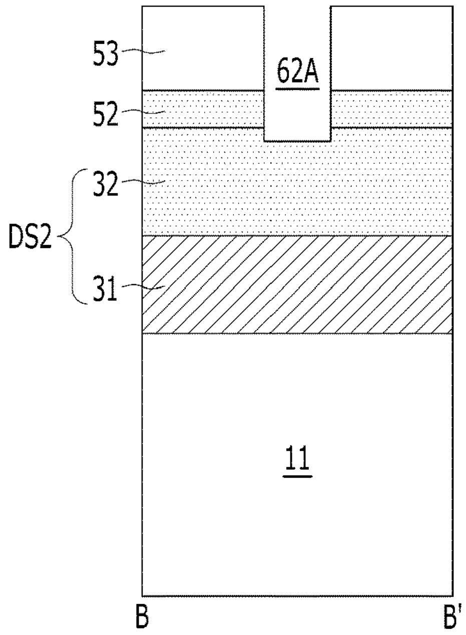
Figure 8C:
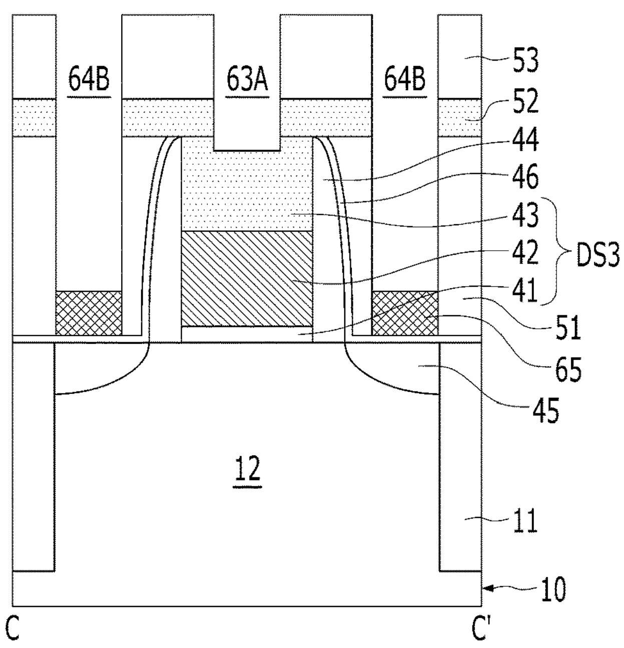

Referring now to FIGS. 8A to 8C, a sacrificial layer 65 gap-filling the bottom portion of the fourth open portion 64B may be formed. To this end, the sacrificial material 65A (see FIG. 7C) may be etched away only to a predetermined depth to allow the sacrificial material 65A to remain in the bottom portion of the fourth open portion 64B. The etching process for forming the sacrificial layer 65 may be performed under a condition of having a selectivity with respect to oxide and nitride materials. For example, an etching process for forming the sacrificial layer 65 may be performed under condition for selectively etching tungsten. The first etch stop layer 46 below the fourth open portion 64B may not be exposed by the etching process for making the sacrificial layer 65.

In the etching process for forming the sacrificial layer 65, the capping layer 23, the first hard mask 32, and the second hard mask 43 exposed on the bottom surfaces of the first to third open portions 61B, 62A, and 63A may be partially lost. However, since the lost thickness of the capping layer 23, the first hard mask 32, and the second hard mask 43 is much smaller than the etched thickness of the sacrificial layer 65, the cell gate electrode 22, the bit line 31, and the peripheral gate electrode 42 overlapping with the first to third open portions 61B, 62A, and 63A are not exposed.

Figure 9A:
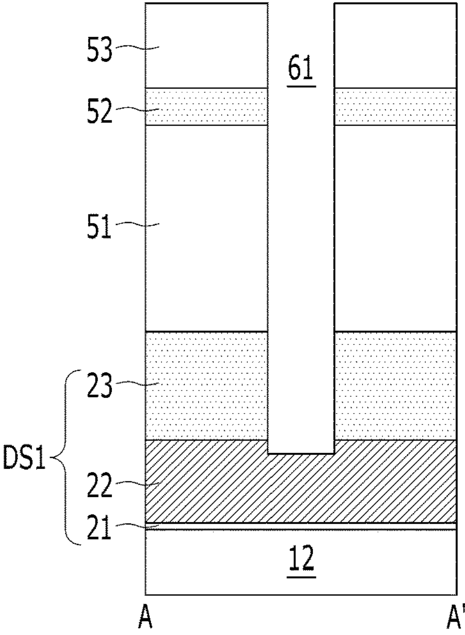
Figure 9B:
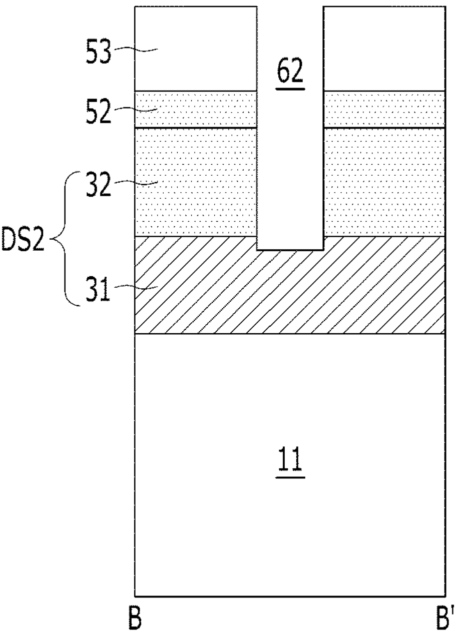
Figure 9C:
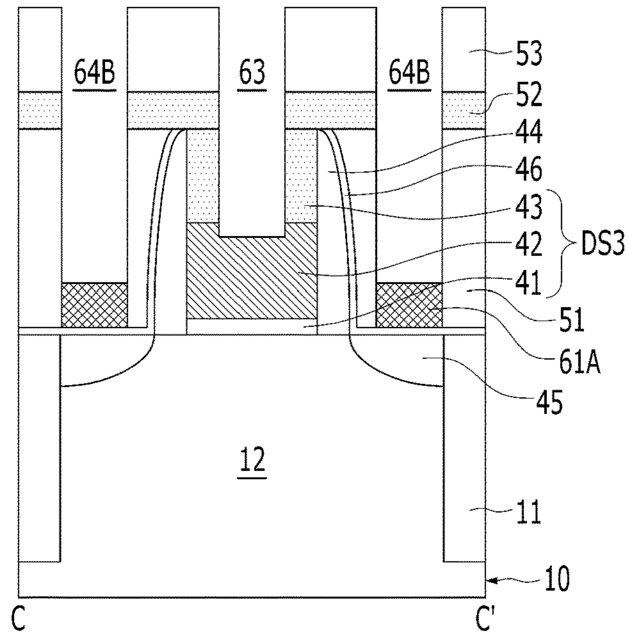

Referring to FIGS. 9A to 9C, first to third contact holes 61, 62, and 63 may be formed. The first to third contact holes 61, 62, and 63 may be formed by etching the bottom surfaces of the first to third open portions 61B, 62A, and 63A (see FIGS. 8A to 8C). The first to third contact holes 61, 62, and 63 may expose portions of the cell gate electrode 22, the bit line 31, and the peripheral gate electrode 42, respectively.

The etching process for forming the first to third contact holes 61, 62, and 63 may be performed under conditions of selectively etching the nitride material. Accordingly, the sacrificial layer 65 having a selectivity with respect to the nitride material may remain at the bottom portion of the fourth open portion 64B without any loss.

Figure 10A:
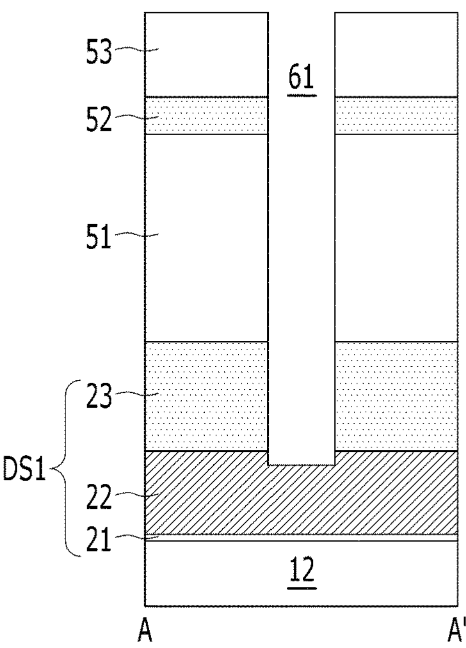
Figure 10B:
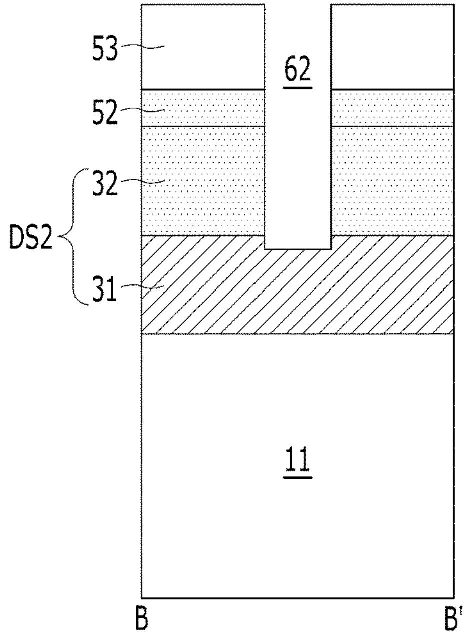
Figure 10C:
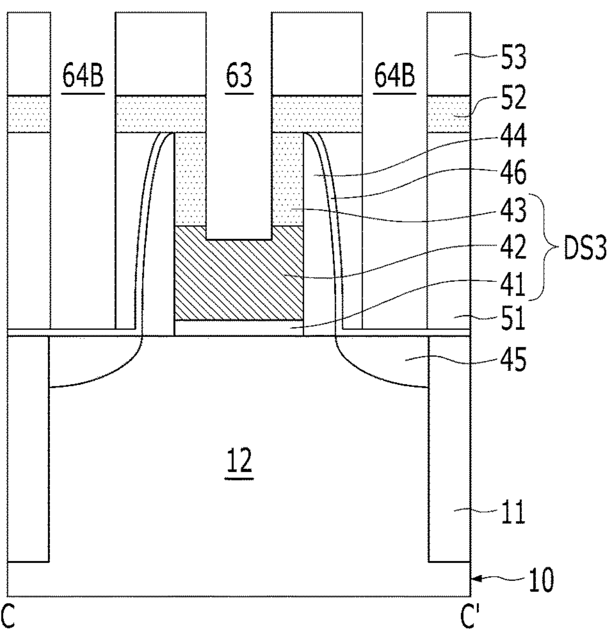

Referring now to FIGS. 10A to 10C, the sacrificial layer 65 of FIG. 9C may be removed. For example, the sacrificial layer 65 of FIG. 9C may be removed through a tungsten etching process. Accordingly, a portion of the first etch stop layer 46 may be exposed on the bottom surface of the fourth open portion 64B.

Figure 11A:
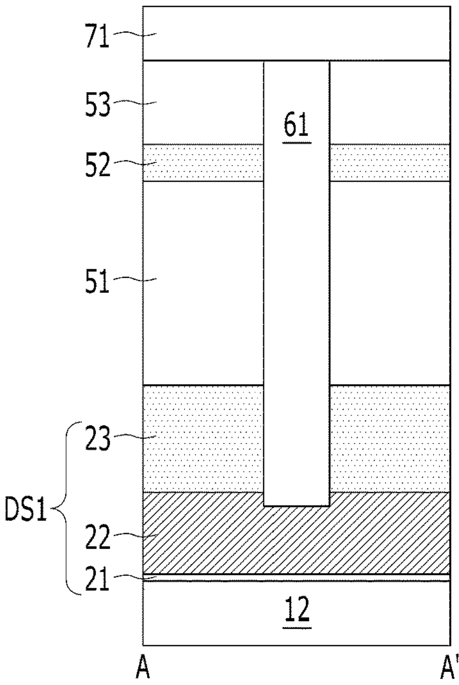
Figure 11B:
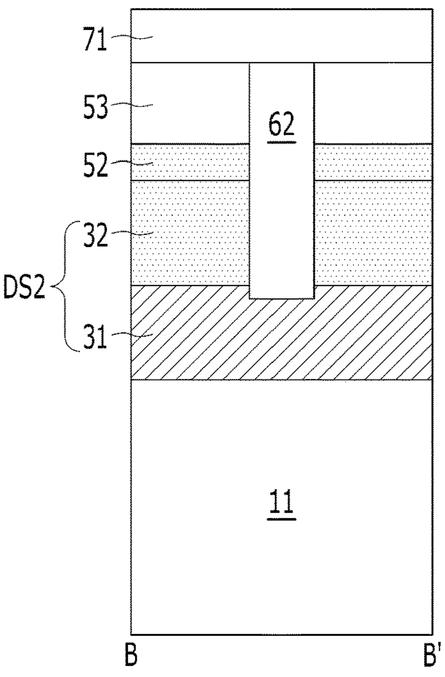
Figure 11C:
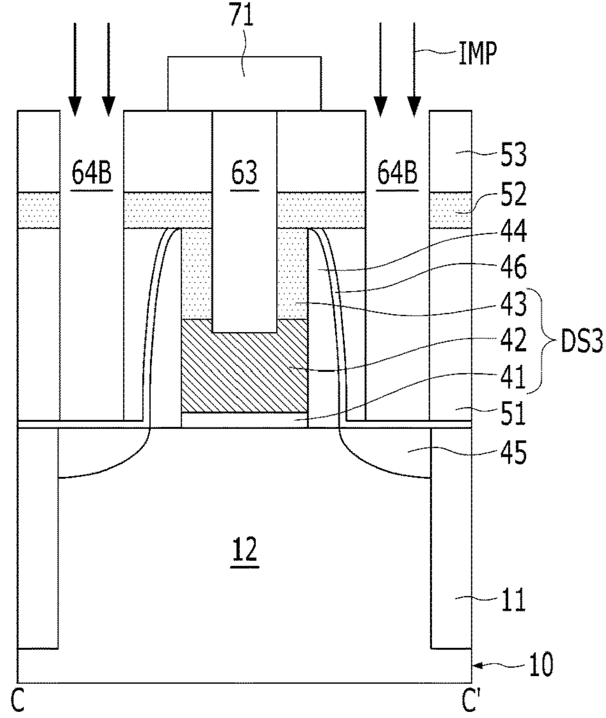

Referring to FIGS. 11A to 11C, a third mask pattern 71 selectively opening the fourth open portion 64B may be formed. For example, the third mask pattern 71 may be formed of a photoresist.

Subsequently, an ion implantation (IMP) process may be performed over the substrate 10 in a region overlapping with the fourth open portion 64B. The ion implantation process may be an impurity doping process for reducing contact resistance. According to another embodiment of the present invention, the source/drain region 45 may be formed during an ion implantation (IMP) process. Since the first etch stop layer 46 remains over the substrate 10 during the ion implantation process, loss of the surface of the substrate 10 may be prevented from being lost due to an ion implantation energy.

Figure 12A:
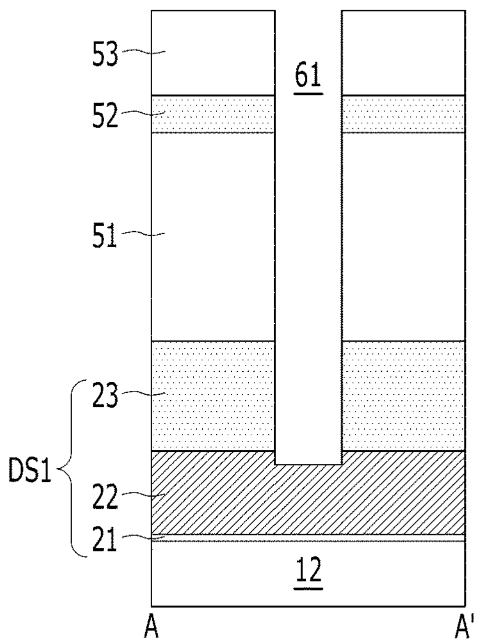
Figure 12B:
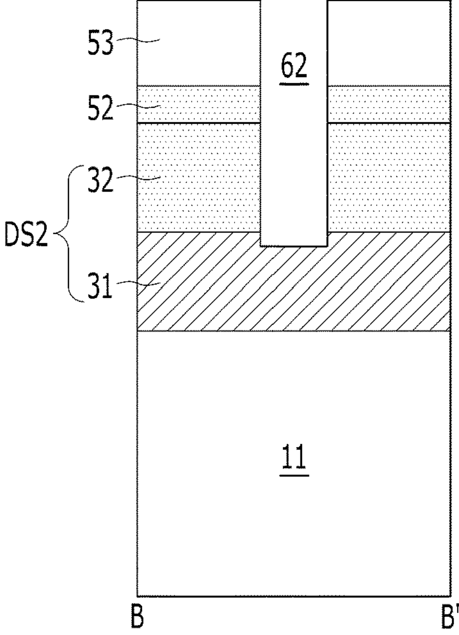
Figure 12C:
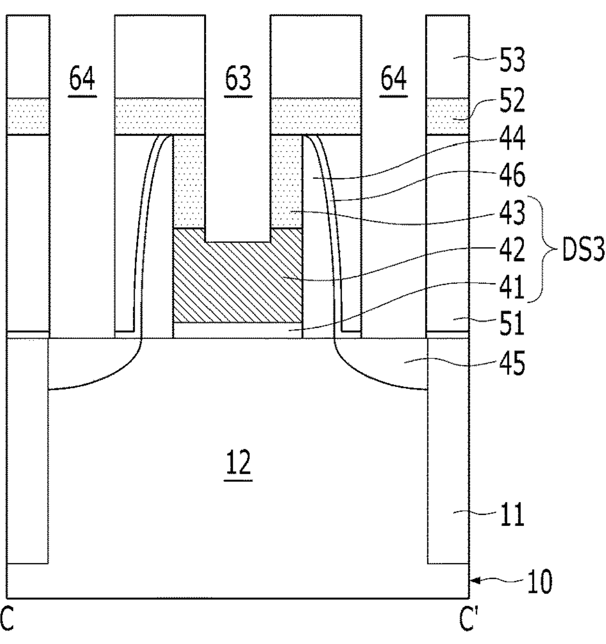

Referring to FIGS. 12A to 12C, a fourth contact hole 64 may be formed. The fourth contact hole 64 may be formed by etching the first etch stop layer 46 on the bottom surface of the fourth open portion 64B (see FIG. 11C). The fourth contact hole 64 may partially expose the substrate 10 of FIG. 12C.

Figure 13A:
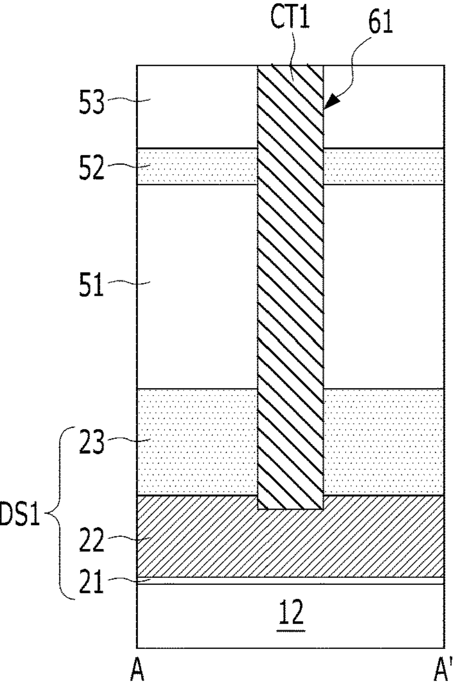
Figure 13B:
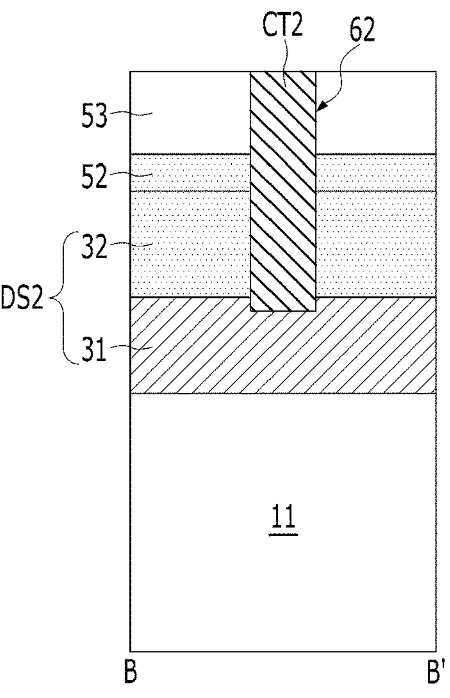
Figure 13C:
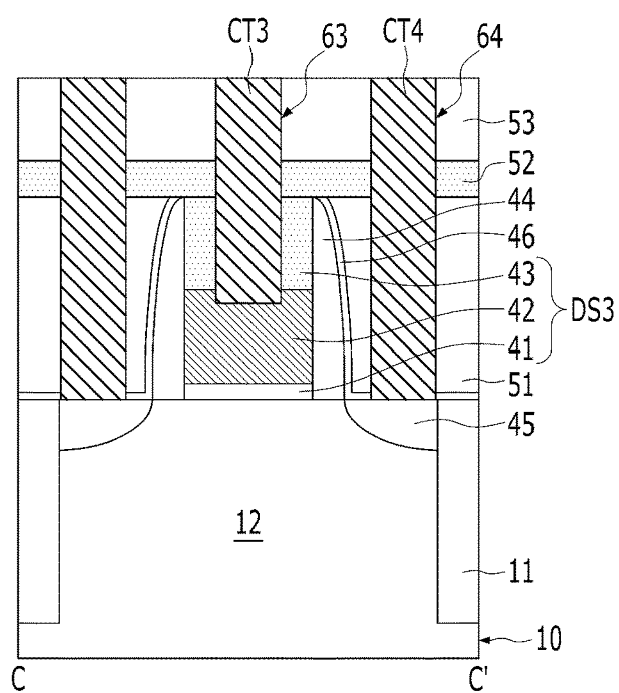

Referring to FIGS. 13A to 13C, the first to fourth contacts CT1, CT2, CT3, and CT4 may be formed by gap-filling the first to fourth contact holes 61, 62, 63, and 64 with a conductive material. For example, the conductive material may include tungsten (W), but the concepts and scope of the present invention are not limited thereto. For example, the first to fourth contacts CT1, CT2, CT3, and CT4 may be Metal Contact. The first to fourth contacts CT1, CT2, CT3, and CT4 may be referred to as M0C.

As described above, according to the embodiment of the present invention, the first to fourth contacts CT, CT2, CT3, and CT4 coupled to conductive structures of different levels or different top surfaces and having the same top surfaces may be formed, thereby facilitating the coupling between the conductive structures and the metal line.

Also, according to the embodiment of the present invention, it is possible to minimize the loss of the substrate 10 that may be caused by the difference in etching height by taking advantage of the difference in the etch selectivity between a nitride material, an oxide material, and a conductive material, and minimizing the exposure of the substrate 10 while each contact hole is formed.

According to the embodiment of the present invention, a loss of the substrate may be minimized when contact holes having different etching depths are formed.

According to the embodiment of the present invention, subsequent processes may be facilitated by forming contacts coupled to conductive structures disposed at different levels and having top surfaces at the same level.

According to the embodiment of the present invention, reliability and performance of a device may be improved by minimizing a loss of the substrate.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A method for fabricating a semiconductor device, the method comprising:

forming first and second etch targets, the second etch target being disposed at a higher level than a top surface of the first etch target;

forming a dielectric layer over the first and second etch targets;

forming first and second open portions each having a bottom surface at the same level as a top surface of the second etch target and overlapping with the first and second etch targets, respectively, by etching the dielectric layer;

forming a sacrificial layer to gap-fill the bottom portion of the second open portion;

forming a first contact hole exposing the first etch target by etching the dielectric layer on the bottom surface of the first open portion;

forming a second contact hole exposing the second etch target on the bottom surface of the second open portion by removing the sacrificial layer; and forming a contact by gap-filling the first and second contact holes with a conductive material.

2. The method of claim 1, wherein the forming the sacrificial layer to gap-fill the bottom portion of the second open portion includes:

forming a sacrificial material to fill the first and second open portions;

forming a mask pattern to open the first open portion;

removing the sacrificial material from the first open portion; and etching the sacrificial material from the second open portion such that a portion of the sacrificial material at the bottom portion of the second open portion remains intact.

3. The method of claim 1, wherein the sacrificial layer is a material having etch selectivity with respect to the dielectric layer.

4. The method of claim 1, wherein the sacrificial layer includes a metal material.

5. The method of claim 1, wherein the sacrificial layer includes tungsten.

6. The method of claim 1, wherein the dielectric layer includes silicon oxide, silicon nitride, or a stacked structure thereof.

7. The method of claim 1, wherein the forming the dielectric layer over the first and second etch targets includes:

forming a first dielectric layer whose top surface is at the same level as the top surface of the second etch target over the first etch target; and forming a second dielectric layer over the first dielectric layer and the second etch target.

8. The method of claim 7, wherein the forming the first contact hole exposing the first etch target by etching the dielectric layer on the bottom surface of the first open portion, includes:

etching the first dielectric layer exposed on the bottom surface of the first open portion.

9. The method of claim 7, wherein the first and second dielectric layers include dielectric materials having different etch selectivities.

10. The method of claim 7, wherein the first dielectric layer includes silicon nitride, and the second dielectric layer includes silicon oxide.

11. The method of claim 1, wherein the conductive material includes a metal material.

12. The method of claim 1, wherein the conductive material includes tungsten.

13. The method of claim 1, wherein the first etch target includes a gate electrode of a buried word line that is formed in a substrate of a cell region.

14. The method of claim 1, wherein the second etch target includes a substrate of a peripheral region.

15. A method for fabricating a semiconductor device, the method comprising:

providing a substrate having a first region and a second region;

forming a first conductive structure having a bottom surface at a lower level than a top surface of the substrate and including a first conductive line and a capping layer stacked therein in the substrate of the first region;

forming a second conductive structure in which a second conductive line and a first hard mask are stacked over the substrate of the first region;

forming a third conductive structure in which a third conductive line and a second hard mask are stacked over the substrate of the second region;

forming an interlayer dielectric layer over the first conductive structure and the substrate;

forming first to fourth open portions that pass through the interlayer dielectric layer to partially expose the capping layer of the first conductive structure, the first hard mask of the second conductive structure, the second hard mask of the third conductive structure, and the substrate of the second region, respectively;

forming a sacrificial layer to fill a bottom portion of the fourth open portion;

forming first to third contact holes exposing portions of the first to third conductive lines by etching the capping layer, the first hard mask, and the second hard mask on bottom surfaces of the first to third open portions;

forming a fourth contact hole exposing a portion of the substrate of the second region by removing the sacrificial layer; and forming first to fourth contacts by gap-filling the first to fourth contact holes with a conductive material.

16. The method of claim 15, wherein the first region is a cell region, and the second region is a peripheral region.

17. The method of claim 15, further comprising:

before forming the interlayer dielectric layer, forming an etch stop layer over the substrate of the second region.

18. The method of claim 17, wherein the forming the fourth contact hole exposing the portion of the substrate of the second region by removing the sacrificial layer includes:

removing the sacrificial layer; and etching the etch stop layer exposed on a bottom surface of the fourth open portion.

19. The method of claim 15, wherein the first conductive structure includes a buried gate structure.

20. The method of claim 15, wherein the second conductive structure includes a bit line structure.

21. The method of claim 15, wherein the third conductive structure includes a peripheral gate structure.

22. The method of claim 15, wherein the substrate of the peripheral region exposed by the fourth contact hole includes source/drain regions of a peripheral gate.

23. The method of claim 15, wherein the forming the sacrificial layer to fill the bottom portion of the fourth open portion includes:

forming a sacrificial material to fill the first to fourth open portions;

forming a mask pattern to open the first to third open portions;

removing sacrificial materials from the first to third open portions; and etching the sacrificial material of the fourth open portion to a predetermined depth.

24. The method of claim 15, wherein the capping layer, the first hard mask, and the second hard mask include a dielectric material having the same etch selectivity.

25. The method of claim 15, wherein the capping layer, the first hard mask, and the second hard mask include silicon nitride.

26. The method of claim 15, wherein the interlayer dielectric layer includes a material having etch selectivity with respect to the capping layer, the first hard mask, and the second hard mask.

27. The method of claim 15, wherein the interlayer dielectric layer includes silicon oxide.

28. The method of claim 15, wherein the sacrificial layer includes a material having etch selectivity with respect to the capping layer, the first hard mask, the second hard mask, and the interlayer dielectric layer.

29. The method of claim 15, wherein the sacrificial layer includes a metal material.

30. The method of claim 15, wherein the sacrificial layer includes tungsten.

31. The method of claim 15, further comprising:

performing an ion implantation process onto the substrate of the exposed peripheral region, after forming the fourth contact hole.

32. The method of claim 15, wherein the conductive material includes a metal material.

33. The method of claim 15, wherein the conductive material includes tungsten.

* * * * *